(12) United States Patent
Anderson et al.

(10) Patent No.: US 7,274,194 B1
(45) Date of Patent: Sep. 25, 2007

(54) APPARATUSES AND METHODS FOR REPAIRING DEFECTS IN A CIRCUIT

(75) Inventors: Frank Edward Anderson, Sadieville, KY (US); Elios Klemo, Lexington, KY (US); Bryan Dale McKinley, Lexington, KY (US); George Nelson Woolcott, Lancaster, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 11/378,217

(22) Filed: Mar. 17, 2006

(51) Int. Cl.
*G01R 31/08* (2006.01)
*G01R 27/08* (2006.01)
*G01R 31/26* (2006.01)

(52) U.S. Cl. ............... 324/522; 324/523; 324/718; 324/765

(58) Field of Classification Search ............ 324/522, 324/530, 765, 523, 718
See application file for complete search history.

(56) References Cited

U.S. PATENT DOCUMENTS

| | | | |
|---|---|---|---|
| 5,764,793 A * | 6/1998 | Omae et al. ............... 382/149 |
| 5,883,437 A * | 3/1999 | Maruyama et al. ......... 257/773 |
| 6,144,210 A | 11/2000 | Brooks |
| 6,253,621 B1 * | 7/2001 | Jarvis ........................ 73/655 |
| 2005/0046435 A1 * | 3/2005 | Ishikawa et al. ............ 324/765 |
| 2006/0043153 A1 * | 3/2006 | Yamaoka et al. ............. 228/10 |

* cited by examiner

*Primary Examiner*—Anjan Deb
*Assistant Examiner*—Amy He
(74) *Attorney, Agent, or Firm*—Dinsmore & Shohl, LLP

(57) ABSTRACT

Methods and apparatuses to repair defects in a circuit, such as during or subsequent to the manufacture of the circuit. Defects may be detected through, for example, optical processing of an acquired image of the circuit or by measuring the strength of a signal emitted across a pair of conductor plates. If defects are detected, conductive particles may be applied to the circuit to correct the detected defects.

18 Claims, 5 Drawing Sheets

APPARATUSES AND METHODS FOR REPAIRING DEFECTS IN A CIRCUIT

FIELD OF THE INVENTION

The present invention is directed to apparatuses and methods for repairing defects in a circuit, and, more particularly, in one embodiment, to apparatuses and methods for repairing defects in a circuit without requiring contact with the circuit.

BACKGROUND OF THE INVENTION

A circuit, such as a circuit board, typically includes patterns of conductive material attached to a non-conductive carrier (e.g., a board or other substrate). For example, conductive wires and other circuit elements may be attached to a non-conductive board or substrate. In order for the circuit to function properly, there should be no defects in the conductive material that might interrupt the planned flow of electricity in the circuit. Therefore, it may be necessary to test the conductive material for defects. Typically, if a defect exist, there will be an unusually high resistance in a conductor.

Several methods exist in the prior art for testing circuit boards for defects. One such method involves the use of a flying probe tester that brings test probes into contact with the end points of each conductor and measures the resistance of the path. This method has the disadvantage of being very slow and mechanically difficult to manage because all conductor paths must be tested individually by contacting the circuit board with test probes.

Similar to a flying probe tester, a bed of nails tester makes contact with a circuit board in order to locate defects. In this type of tester, a testing instrument having many compressible contact points or nails is placed into contact with a circuit board. Each of the contact points are input into a multiplexer which cycles the testing instrument through all combinations of nails that should span a common conductor. In this manner, the integrity of the conductors is verified. A bed of nails tester, however requires an expensive custom fixture designed for a particular circuit board and is typically utilized only with circuit boards undergoing mass production.

Another method for detecting circuit defects is the performance of an optical inspection of the exposed conductors. Images are acquired of the circuit board and processed to locate faults. This method is not very accurate because only defects large enough to be captured by the camera will be detected. Therefore, many conductors may have faults that will go undetected because they do not show a visible feature. An X-Ray machine may also be used to locate conductor defects. This method may be capable of revealing internal conductor faults, but it requires complicated machinery and a knowledgeable operator. Detecting faults in this manner, therefore, can be very expensive due to equipment cost and the skill intensive requirements of an operator.

All of the methods described above are designed to be performed following the construction of a circuit board. In these traditional tests, detection cannot be performed until the circuit board has finished undergoing an etching chemical process to remove unwanted conductor material. An alternative method for constructing a circuit involves a process in which conductors are applied to the substrate instead of conductive material being removed from a previously uniform covering.

Accordingly, there is a need for an improved method of repairing circuit defects that can be conducted concurrently with the assembly of the circuit board without making contact with the circuit.

SUMMARY OF THE INVENTION

According to one embodiment of the invention, there is disclosed a method for repairing defects in a circuit. The method includes detecting a defect in a circuit. If a defect is detected, conductive particles are applied to the circuit to correct the detected defect. The acts of detecting and applying are performed using the same apparatus.

According to a further exemplary embodiment, the act of detecting defects includes emitting a signal across a first conductor plate, receiving the signal by a second conductor plate, and measuring the strength of the signal received by the second conductor plate. The measured signal strength can be examined in order to, for example, detect defects in the circuit. Alternatively, defects may be detected by acquiring an image of the circuit and optically processing the image in order to locate defects.

According to another embodiment of the inventions, there is disclosed an apparatus for repairing defects in a circuit. The apparatus includes a detector configured to detect a defect in a circuit and a printing device, such as an inkjet print head, configured to apply conductive particles to the circuit. In some embodiments, defects in the circuit are detected without making contact with the circuit.

Other embodiments, objects, features and advantages of the present inventions will become apparent to those skilled in the art from the detailed description, the accompanying drawings and the appended claims.

BRIEF DESCRIPTION OF THE DRAWINGS

Figure 1:
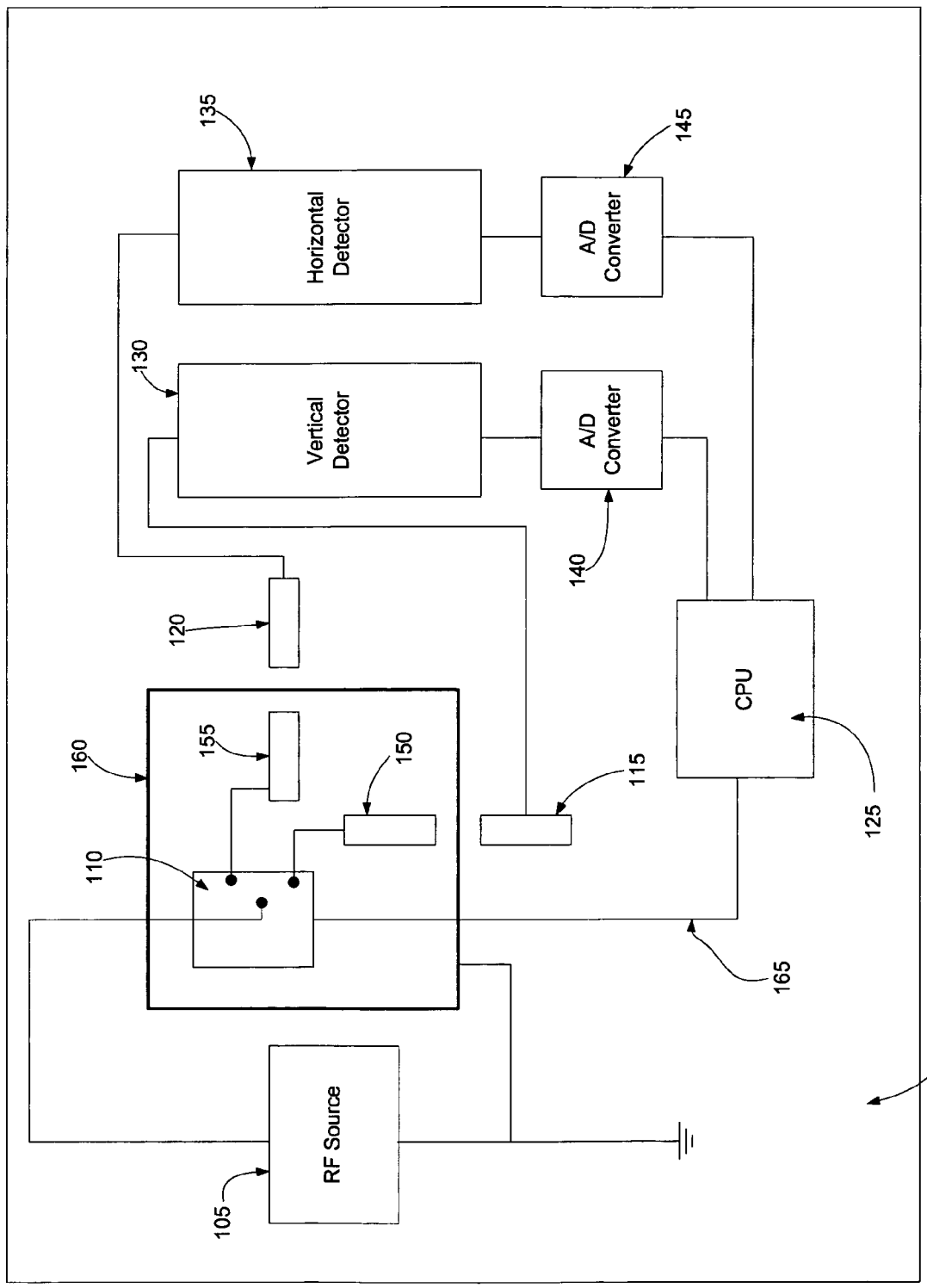

Having thus described the invention in general terms, reference will now be made to the accompanying drawings, which are not necessarily drawn to scale, and wherein:

FIG. 1 is a schematic diagram of an apparatus for repairing defects in a circuit, according to an illustrative embodiment of the present invention.

Figure 2:
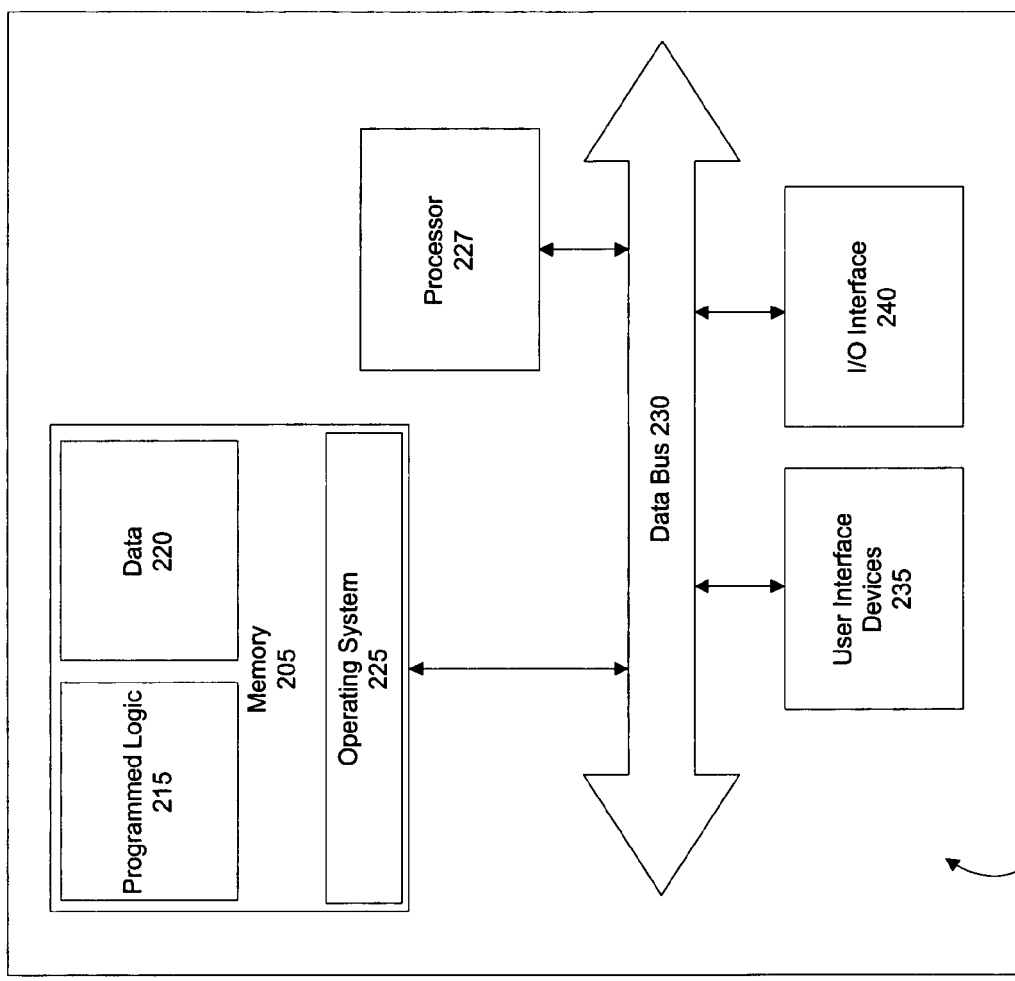

FIG. 2 is a block diagram of a control unit used in an apparatus for repairing defects in a circuit, according to an illustrative embodiment of the present invention.

Figure 3:
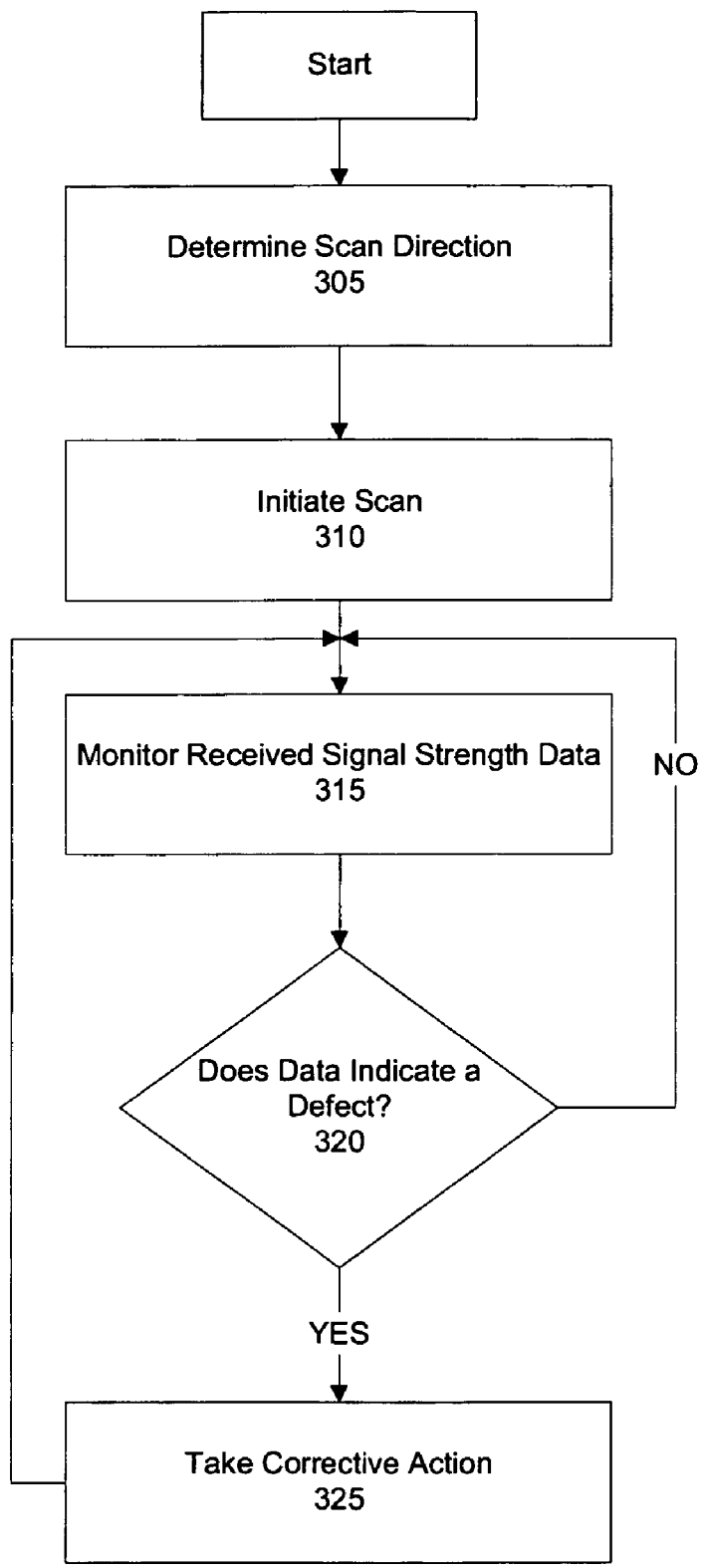

FIG. 3 is an exemplary flowchart of the control logic used by the control unit, according to an embodiment of the present invention.

Figure 4:
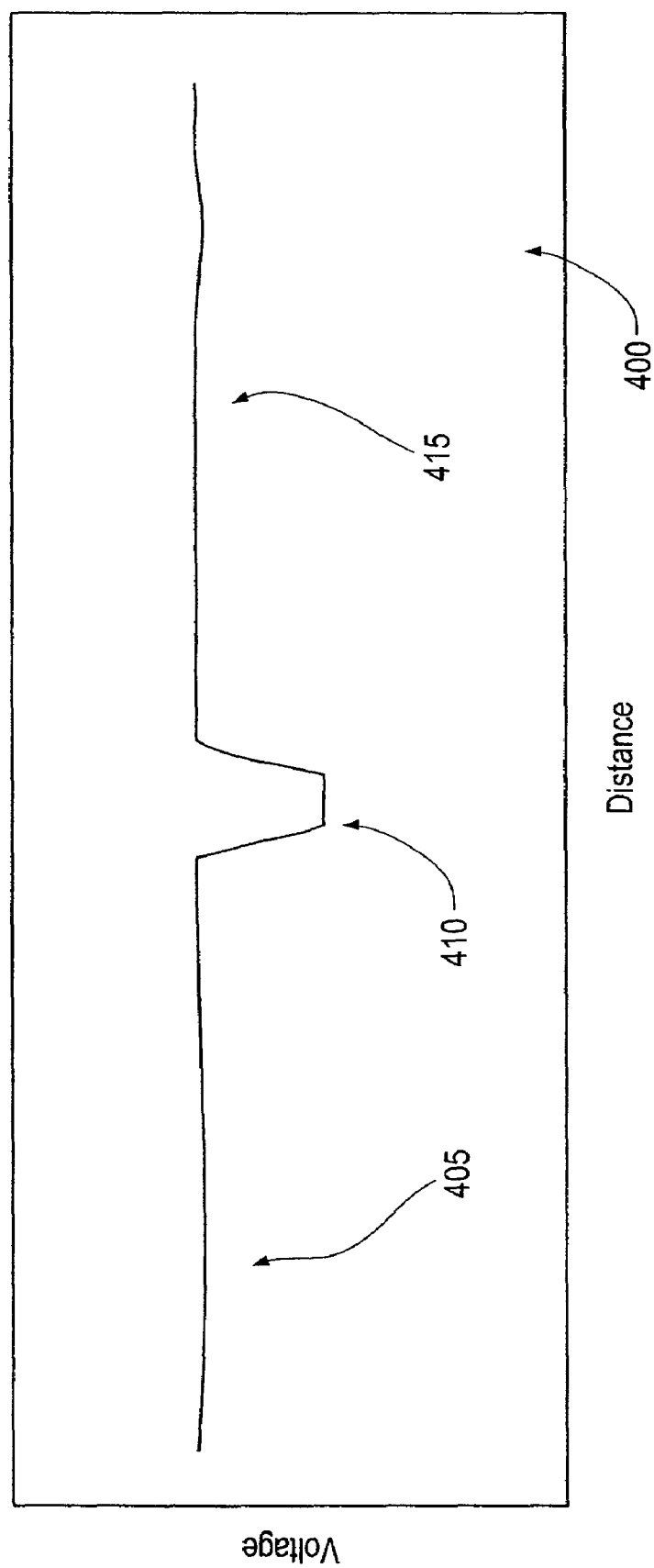

FIG. 4 is a graph depicting an example of data analyzed by the control unit, according to an embodiment of the present invention.

Figure 5:
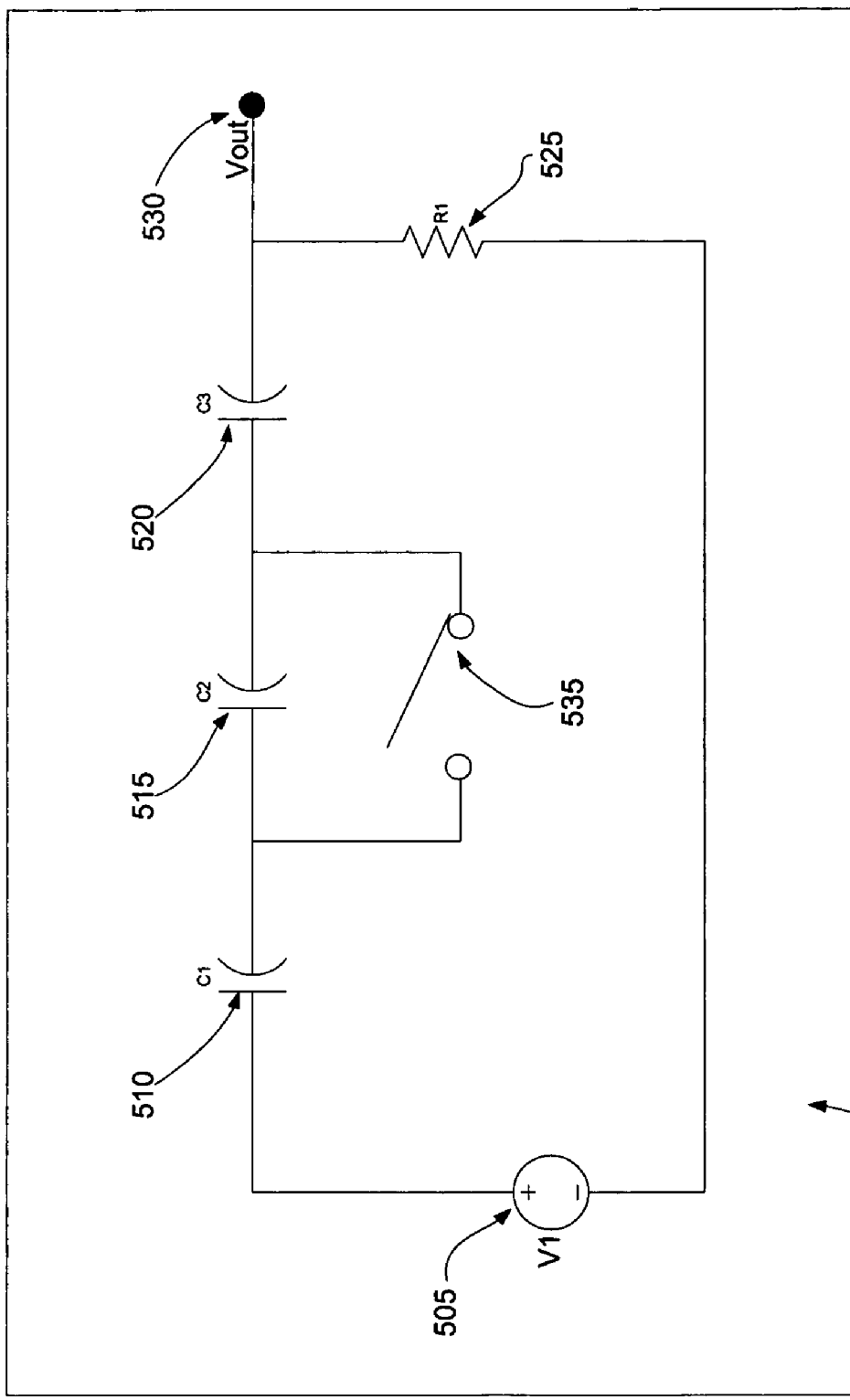

FIG. 5 is an example of a circuit demonstrating a voltage drop across a conductor fault, according to an embodiment of the present invention.

DETAILED DESCRIPTION OF EXEMPLARY EMBODIMENTS OF THE INVENTIONS

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The present inventions are described below with reference to block diagrams of systems, methods, apparatuses and computer program products according to an exemplary embodiment. It will be understood that each block of the block diagrams, and combinations of blocks in the block diagrams, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create means for implementing the functionality of each block of the block diagrams, or combinations of blocks in the block diagrams discussed in detail in the descriptions below.

These computer program instructions may also be stored in a computer-readable memory that can direct a computer or other programmable data processing apparatus to function in a particular manner, such that the instructions stored in the computer-readable memory produce an article of manufacture including instruction means that implement the function specified in the block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the block or blocks.

Accordingly, blocks of the block diagrams support combinations of means for performing the specified functions, combinations of steps for performing the specified functions and program instruction means for performing the specified functions. It will also be understood that each block of the block diagrams, and combinations of blocks in the block diagrams, can be implemented by special purpose hardware-based computer systems that perform the specified functions or steps, or combinations of special purpose hardware and computer instructions.

The inventions may be implemented through an application program running on an operating system of a computer. The inventions also may be practiced with other computer system configurations, including hand-held devices, multiprocessor systems, microprocessor based or programmable consumer electronics, mini-computers, mainframe computers, etc.

Application programs that can be components of the invention may include routines, programs, components, data structures, etc. that implement certain abstract data types, perform certain tasks, actions, or tasks. In a distributed computing environment, the application program (in whole or in part) may be located in local memory, or in other storage. In addition, or in the alternative, the application program (in whole or in part) may be located in remote memory or in storage to allow for the practice of the inventions where tasks are performed by remote processing devices linked through a communications network. Exemplary embodiments of the present inventions will hereinafter be described with reference to the figures, in which like numerals indicate like elements throughout the several drawings.

FIG. 1 is a schematic diagram of an apparatus for repairing defects in a circuit, according to an illustrative embodiment of the present invention. A detector, such as detection apparatus 100, may include an RF source 105, an emitter pad 110, a horizontal scan plate 120, a vertical scan plate 115, a control unit 125, a vertical detection circuit 130, a horizontal detection circuit 135, and two analog-to-digital converters 140, 145. Further, the emitter pad 110 may include a horizontal emitter plate 155, a vertical emitter plate 150, and a conductor shield 160. The emitter pad 110 emits a signal through at least one of the emitter plates 150, 155 that creates an electric field between at least one of the emitter plates 150, 155 and at least one of the scan plates 115, 120. This electric field is detected by at least one of the detection circuits 130, 135 and passed to the control unit 125, where conductor defects may be identified, as will be explained in greater detail below.

According to one embodiment of the present invention, the RF source 105 provides a signal to the emitter pad 110 that is used to emit an electric field from the emitter pad 110. The RF source may be a one hundred MHz radio frequency signal, but it is to be understood that any signal capable of producing an electric field between plates of a capacitor may be used in such an embodiment. The emitter pad 110 may emit the signal through the horizontal emitter plate 155 or the vertical emitter plate 150, depending on whether the circuit will be scanned in the horizontal direction or the vertical direction, as will be explained in greater detail below.

At least one of the two scan plates 115, 120 may receive the electric field emanating from one of the two emitter plates 150, 155. More particularly, the horizontal scan plate 120 may receive the signal emitted through the horizontal emitter plate 155, and the vertical scan plate 115 may receive the signal emitted through the vertical emitter plate 150. All of the plates 115, 120, 150, 155 may be constructed out of conductive plates so that adjacent plates function as a capacitor. More specifically, a capacitor may be created by the horizontal emitter plate 155 being placed in parallel with the horizontal scan plate 120. Similarly, a capacitor may be created by the vertical emitter plate 150 being placed in parallel with the vertical scan plate 115. It will be understood by those skilled in the art that the plates 115, 120, 150, 155 can be constructed out of any material such that a capacitor is created out of plates placed next to one another in a parallel arrangement.

Additionally, a conductor shield 160 may be formed along the edge of the emitter pad 110 in such a manner as to separate the emitter plates 150, 155 and the scan plates 115, 120. More particularly, the conductor shield 160 may be formed between the horizontal emitter plate 155 and the horizontal scan plate 120. Similarly, the conductor shield 160 may be formed between the vertical emitter plate 150 and the vertical scan plate 115. The conductor shield 160 may reduce the direct reception of a signal emanating from the emitter pad 110 that is received by one of the scan plates 115, 120. Furthermore, the conductor shield 160 may be constructed from any insulator or dielectric material suitable for use between the plates of a capacitor, as will be understood by those of ordinary skill in the art. According to an exemplary embodiment of the present invention, the emitter pad 110, the horizontal scan plate 120, and the vertical scan plate 115 may be passed over one or more conductors of a circuit in order to detect defects in the conductors.

A motorized carrier (not shown), as will be understood by those skilled in the art, can carry the emitter pad 110, horizontal scan plate 120, and vertical scan plate 115 over the one or more conductors. The motorized carrier may move in either a horizontal or a vertical direction. It is to be understood, however, that the motorized carrier may be moved in any direction over the conductors of a circuit. Furthermore, the motorized carrier may be moved over the conductors of a circuit without making contact with the circuit. The movement of the motorized carrier may be controlled by the control unit 125. According to yet another embodiment of the present invention, the circuit pattern may be stored in the control unit 125, as will be explained in greater detail below. With data related to the conductor pattern of the circuit, the control unit 125 may control the movement of the motorized carrier over the circuit so as to pass over all areas of the conductors on the circuit. It will further be understood that the control unit 125 could direct the movement of additional motorized carriers containing emitter pads and scan plates in order to scan multiple areas of a circuit simultaneously.

The scan plates 115, 120 can be connected to detection circuits 130, 135 capable of measuring the signal strength between the scan plates 115, 120 and the emitter pad 110. More particularly, the horizontal scan plate 120 might be connected to a horizontal detection circuit 135, while the vertical scan plate 115 is connected to a vertical detection circuit 130. The horizontal detection circuit 135 may measure the signal strength between the horizontal emitter plate 155 and the horizontal scan plate 120. Similarly, the vertical detection circuit 130 may measure the signal strength between the vertical emitter plate 150 and the vertical scan plate 115. As will be understood by those of skill in the art, a potential difference or voltage will be generated between the plates of a capacitor. Thus, when the emitter pad 110 is emitting a signal, a voltage may be generated between either the horizontal emitter plate 155 and the horizontal scan plate 120 or between the vertical emitter plate 150 and the vertical scan plate 115.

The horizontal detection circuit 135 may measure the voltage generated between the horizontal emitter plate 155 and the horizontal scan plate 120. The vertical detection circuit 130 may measure the voltage between the vertical emitter plate 150 and the vertical scan plate 115. Further, the detection circuits 130, 135 may have a logarithmic response, as will be understood by those skilled in the art, which allows very small differences in magnitude to be detected. Therefore, very small differences in voltage may be detected by the detection circuits 130, 135.

The voltage measurements detected by the detection circuits 130, 135 may be converted to a digital signal by way of analog-to-digital (A/D) converters 140, 145 and then sent to the control unit 125 for processing. More particularly a voltage measurement detected by the horizontal detection circuit 135 may be passed through a horizontal A/D converter 145 and then passed to the control unit 125. Likewise, a voltage measurement detected by the vertical detection circuit 130 may be passed through a vertical A/D converter 140 and then passed to the control unit 125.

The control unit 125 can control the movement of the motorized carrier over the circuit and process data measurements received from the A/D converters 140, 145 in order to detect defects in the circuit. The control unit 125 may control the movement of the motorized carrier through a movement connection 165, which is capable of carrying a signal from the control unit 124 to the motorized carrier. FIG. 2 is a block diagram of the control unit 125, according to an illustrative embodiment of the present invention. The control unit 125 can include a memory 205 that stores programmed logic 215 (e.g., software). The memory 205 might also include measurement data 220 utilized in the operation of the present invention and an operating system 225. The measurement data 220 may include the voltage measurements passed to the control unit 125 from the A/D converters 140, 145.

A processor 227 can utilize the operating system 225 to execute the programmed logic 215, and in doing so, also utilize the measurement data 220. A data bus 230 provides communication between the memory 205 and the processor 227. Users interface with the control unit 125 via a user interface device(s) 235 such as a keyboard, mouse, control panel, or any other devices capable of communicating digital data to the control unit 125. The control unit 125 is in communication with the emitter pad 110 and the A/D converters 140, 145 and perhaps other external devices, via an I/O Interface 240. In the illustrated embodiment, the control unit 125 is integrated into the repair apparatus, though it may be co-located or even located remotely to the other components of the apparatus. Further the control unit 125 and the programmed logic 215 implemented thereby may include software, hardware, firmware or any combination thereof.

FIG. 3 is an exemplary flowchart of the control logic used by the control unit 125, according to an embodiment of the present invention. After the detection device is started up, the control unit determines the direction in which a circuit will be scanned at block 305. As mentioned earlier, a pattern of the circuit may be stored in the memory 205 of the control unit 125. The control unit 125 may utilize this pattern to ensure that the motorized carrier, emitter pad 110, and scan plates 115, 120 pass over all areas of the circuit so that every conductor on the circuit may be tested for defects.

After the scan direction has been determined, the control unit 125 initiates a scan of the circuit at block 310. The RF source 105 may begin sending a signal to be emitted by the emitter pad 110. The signal is emitted throughout the scan as the motorized carrier passes over all areas of the circuit. The detection circuits 130, 135 continuously measure the voltage across the conductors formed by the emitter plates 150, 155 and the scan plates 115, 120, as explained above. These voltages are passed to the A/D converters 140, 145, and digital measurement data is passed from the A/D converters 140, 145 to the control unit 125. During the scan, the control unit 125 continuously monitors the measurement data passed to it, as indicated by block 315. The measurement data may be, for example, actual measurements of the voltage across the capacitors or an absolute value representative of a change in the voltage across the capacitors.

At block 320, the control unit 125 determines whether the measurement data indicates a defect along a conductor or a conductor trace in the circuit. If no defect is present, the control unit 125 returns to its monitoring of received measurement data 315. If however, a defect is detected, then the control unit might take corrective action, as indicated by block 325.

According to an embodiment of the present invention, this corrective action 325 may be any control action. Control actions may include, but are not limited to transmitting a defect detection message, shutting down the scan, or initiating a procedure to repair the defective conductor. Repairing the defective conductor may include jetting conductive particles onto the circuit to eliminate the defect, such as by using a printing device such as an inkjet print head. Additionally, any transmitting of defect messages may be recorded in the memory 205 of the control system 125.

The voltage across a capacitor will be significantly higher when a scanned conductor has no defects in it. When a conductor defect is passed over, there will be a sudden drop in voltage due to the greater resistance created by the defect in the conductor. This greater resistance will disrupt the electric field between the plates of a conductor leading to a lower voltage through the conductor.

While monitoring received measurement data 320, the control unit 125 may attempt to locate instances in which the voltage measured across a capacitor drops suddenly and then recovers, indicating a place in which the circuit conductor has a higher resistance or impedance than average. The control unit 125 may monitor the rate of change in measured voltage per distance traveled along a trace of the conductor to determine whether or not there is a defect in the conductor. In this manner, the control unit 125 may locate defects in a circuit without making contact with the circuit. It will also be understood by those skilled in the art that defects could be detected by using an optical scanning technique in which images of a circuit are processed in order to locate defects.

A scan for defects may be conducted, for example, during the manufacture of a circuit, or during a defect detection process subsequent to manufacture. Additionally, as previously referenced, a defect may be repaired by jetting conductive particles or conductive ink on a circuit to generate a conductive circuit trace that is substantially free of defects. A printing device, such as an inkjet print head (not shown), may be utilized to deposit droplets of conductive ink onto the circuit to create a conductive pathway as described in U.S. patent application Ser. No. 11/305,828, filed on Dec. 16, 2005, which is assigned to the assignee of the present invention, the entire contents of which are incorporated herein by reference.

The inkjet print head may be controlled by the control unit 125 or by a separate controller that receives a detect detection signal from the control unit. By combining defect detection means with an inkjet print head capable of depositing conductive particles on a circuit, defects may be detected and automatically repaired during the manufacturer of the circuit. In an exemplary embodiment, the inkjet printhead can be carried by the same carrier as that used with the emitter pad 110, horizontal scan plate 120, and/or vertical scan plate 115. Further, although the repairing of a circuit is described herein with respect to the capacitive detection method described above, the repair may also be the result of an optical detection of defects in the circuit. Similar to the capacitive detection method, an illustrative embodiment of the present invention might utilize the same carrier to carry both an inkjet printhead and an optical emitter and/or sensor.

FIGS. 4-5 illustrate an example of the detection of a defect in a circuit, according to an embodiment of the present invention. FIG. 4 is a graph depicting a voltage 400 passed across a conductor during the scan of a conductor that contains a defect. The measured voltage 400 of FIG. 4 may represent an analog voltage detected by one of the detection circuits 130, 135 or a digital voltage passed to the control unit 125 from one of the A/D converters 140, 145. The first area 405 of the graph depicts a relatively high voltage passing across a conductor. There is a sudden drop or dip in the voltage in the second area 410 of the graph followed by a return to a relatively high voltage in the third area 415 of the graph. The dip in voltage shown in the second area 410 indicates a defect in the conductor being scanned. This drop in voltage will be recognized by the control unit 125 and an appropriate corrective action may be taken.

FIG. 5 is a simple circuit diagram demonstrating a voltage drop across a conductor fault, according to an embodiment of the present invention. FIG. 5 is representative of the defect graphically depicted in FIG. 4. The circuit in FIG. 5 is included only to aid in understanding the operation of the present invention, and it illustrates measurements that may be taken and analyzed as a circuit diagram 505. As illustrated in FIG. 5, a voltage source 505 emits a signal through three capacitors 510, 515, 520 and then through a resistor 525. The three capacitors 510, 515, 520 are representative of the three areas 405, 410, 415 of the graph in FIG. 4.

More particularly, the first capacitor 510 corresponds to the first area 405 in which there is no defect in a conductor; the second capacitor 515 corresponds to the second area 410 in which there is a defect in a conductor; and the third capacitor 520 corresponds to the third area 415 in which there is no defect in a conductor. A switch 535 may be closed allowing current in the circuit 500 to bypass the second capacitor 515. With the switch 535 closed, the current in the circuit 500 flows through the first capacitor 510, the third capacitor 520, and the resistor 525 only. If the voltage of the circuit 500 is measured at an output pin 530, it will be significantly higher than a voltage measurement if the switch 535 were open, indicating a good conductor. If the switch 535 were opened, however, the current in the circuit 500 would flow through all three capacitors 510, 515, 520 and the resistor. If the voltage of the circuit 500 is measured at an output pin 530, it will be significantly lower than the prior measurement, indicating a defect in the conductor. Because of the added resistance created by the defect, capacitance of the second capacitor 515 will be greater than the other two capacitors 510, 520, which leads to a lower voltage being passed across the capacitor. Therefore, at the output pin 530, the potential of the circuit 500 will be lower, leading to a lower voltage reading which is representative of the defect in the conductor.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method for repairing defects in a circuit comprising:
   detecting defects in a circuit, wherein the act of detecting comprises emitting a signal across a first conductor plate, receiving the signal by a second conductor plate, and measuring the strength of the signal received by the second conductor plate; and
   if a defect is detected, applying conductive particles to the circuit to correct the detected defect,
   wherein the acts of detecting and applying are performed using the same apparatus; and wherein no contact is made with the circuit during the detection of defects.

2. The method of claim 1, wherein detecting defects further comprises:
   acquiring an image of the circuit; and
   optically processing the image to generate an input signal.

3. The method of claim 1, wherein the emitted signal is a radio frequency signal.

4. The method of claim 1, further comprising:
   emitting the signal across a third conductor plate;
   receiving the signal by a fourth conductor plate;
   measuring the strength of the signal received by the fourth conductor plate; and
   detecting defects in the circuit based on the measured signal strength.

5. The method of claim 1, wherein the first conductor plate and the second conductor plate form a parallel plate capacitor.

6. The method of claim 5, wherein the capacitor is operable to be passed over a circuit in one of a horizontal direction or a vertical direction.

7. The method of claim 1, further comprising:
carrying the first conductor plate and the second conductor plate over a circuit in one of a horizontal direction or a vertical direction.

8. The method of claim 7, wherein a control unit directs the movement of the first conductor plate and the second conductor plate over the circuit.

9. The method of claim 1, wherein measuring comprises measuring a voltage across the first conductor and the second conductor.

10. The method of claim 1, further comprising converting an analog measurement to a digital signal.

11. The method of claim 1, wherein detecting comprises detecting defects in a circuit during manufacture of the circuit.

12. The method of claim 11, wherein applying the conductive particles occurs during the manufacture of the circuit.

13. The method of claim 11, wherein applying the conductive particles occurs subsequent to the manufacture of the circuit.

14. The method of claim 1, wherein detecting comprises detecting a defect having a width of approximately one micrometer situated in a substrate having a thickness of approximately two micrometers.

15. The method of claim 1, further comprising taking a control action if a defect is detected.

16. An apparatus for repairing defects in a circuit, comprising:
a carrier;
a detector at least partially carried by the carrier and configured to detect a defect in a circuit by measuring a strength measurement of a signal passed through a circuit; and
a printing device carried by the carrier and configured to apply conductive particles to the circuit to correct the detected defect; and
wherein the detector and the printing device do not make contact with the circuit.

17. The apparatus of claim 16, further comprising a control unit in communication with the detector, the control unit including program logic operable to detect defects in the circuit based on the received strength measurement and, if a defect is detected, to correct the defect by controlling the printing device.

18. A method for repairing defects in a circuit comprising:
detecting defects in a circuit; and
if a defect is detected, applying conductive particles to the circuit to correct the detected defect,
wherein the acts of detecting and applying are performed using the same apparatus; wherein no contact is made with the circuit during the detection of defects; and wherein detecting of the defect cannot be done visually or optically.

* * * * *